United States Patent [19]

Mischel et al.

[11] Patent Number: 5,130,526
[45] Date of Patent: Jul. 14, 1992

[54] CIRCUIT ARRAY FOR OPTICAL SCHMITT TRIGGER

[75] Inventors: Peter Mischel, Heilbronn; Bernhard Schuch, Neusitz; Ulrich Wicke, Flein, all of Fed. Rep. of Germany

[73] Assignee: Telefunken electronic GmbH, Heilbronn, Fed. Rep. of Germany

[21] Appl. No.: 663,025

[22] Filed: Mar. 1, 1991

[30] Foreign Application Priority Data

Mar. 2, 1990 [DE] Fed. Rep. of Germany ..... 40065049

[51] Int. Cl.[5] ............................................. H01J 40/14
[52] U.S. Cl. ............................ 250/214 R; 250/214 A; 307/311
[58] Field of Search .................... 250/214 R, 214 A; 302/311, 261, 264, 268, 290

[56] References Cited

U.S. PATENT DOCUMENTS

| | | | |
|---|---|---|---|
| 3,679,916 | 7/1972 | Siebers | 307/290 |
| 3,993,569 | 11/1976 | Zinsmeyer et al. | 250/214 R |
| 4,076,977 | 2/1978 | Tsunekawa et al. | 307/311 |
| 4,085,411 | 4/1978 | Genesi | 307/311 |
| 4,562,362 | 12/1985 | Stenbock | 307/290 |
| 4,743,957 | 5/1988 | Hirayama | 307/450 |
| 4,943,713 | 7/1990 | Wilder | 250/214 R |
| 4,945,227 | 7/1990 | Jones et al. | 307/311 |

FOREIGN PATENT DOCUMENTS

| | | |
|---|---|---|
| 0206334 | 12/1986 | European Pat. Off. . |
| 1762156 | 4/1970 | Fed. Rep. of Germany . |
| 2431487 | 1/1975 | Fed. Rep. of Germany . |
| 2610762 | 9/1977 | Fed. Rep. of Germany . |
| 143843 | 9/1980 | Fed. Rep. of Germany . |
| 144490 | 10/1980 | Fed. Rep. of Germany . |
| 144491 | 10/1980 | Fed. Rep. of Germany . |
| 210378 | 6/1984 | Fed. Rep. of Germany . |
| 3406882 | 8/1984 | Fed. Rep. of Germany . |
| 3336366 | 5/1985 | Fed. Rep. of Germany . |
| 223316 | 6/1985 | Fed. Rep. of Germany . |
| 3411995 | 10/1985 | Fed. Rep. of Germany . |
| 231694 | 1/1986 | Fed. Rep. of Germany . |
| 238897 | 9/1986 | Fed. Rep. of Germany . |
| 3743766 | 7/1989 | Fed. Rep. of Germany . |
| 3806283 | 9/1989 | Fed. Rep. of Germany . |
| 3825295 | 2/1990 | Fed. Rep. of Germany . |

OTHER PUBLICATIONS

Vanderwege, J. "Schmitt-trigger opto-coupler" in Wireless World, März 1984, S. 40.

Primary Examiner—Janice A. Howell
Assistant Examiner—Kiet T. Nguyen
Attorney, Agent, or Firm—Spencer, Frank & Schneider

[57] ABSTRACT

The invention relates to a circuit array for an optical Schmitt trigger in which an optical input signal is converted into an electrical output signal by means of a light-sensitive receiver element, an amplifier stage, a Schmitt trigger stage and an output stage.

It is provided in accordance with the invention that the amplifier stage contains a transimpedance amplifier stage, a differential amplifier stage, a first reference network and a compensating element, that the Schmitt trigger stage comprises a differential amplifier stage, a second reference network and a positive-feedback network, and that the output signal is emitted at the circuit output of the output stage.

17 Claims, 4 Drawing Sheets

CIRCUIT ARRAY FOR OPTICAL SCHMITT TRIGGER

BACKGROUND OF THE INVENTION

The invention relates to a circuit array for an optical Schmitt trigger in accordance with the preamble of claim 1.

Optical Schmitt triggers are used as radiation receivers in the form of individual components or in sensors, for example in transmissive/reflective photointerrupters or in optical insulators.

The optical receiving part, mostly a photodiode, is used for conversion of the optical radiation into an electrical signal, and the electonic part—amplifier and Schmitt trigger—for processing the input signal; the output signal is emitted at the circuit output. At a certain radiation level of the optical input signal, i.e. when a first threshold value is reached, the output signal is modified; when a second threshold value is reached, it reverts to its original value.

Thanks to the Schmitt trigger function, a pulse is shaped, and interfering signals are largely suppressed by the built-in hysteresis.

SUMMARY OF THE INVENTION

The object underlying the invention is to provide an advantageous circuit array for an optical Schmitt trigger.

This is achieved in accordance with the invention in that the amplifier stage contains a transimpedance amplifier stage, a differential amplifier stage, a first reference network and a compensating element, in that the Schmitt trigger stage comprises a differential amplifier stage, a second reference network and a positive-feedback network, and in that the output signal is emitted at the circuit output of the output stage.

Advantageous embodiments of the circuit in accordance with the invention are shown in the sub-claims.

The block circuit diagram in FIG. 1 shows the various circuit components of the optical Schmitt trigger circuit in accordance with the invention; these components are also drawn in FIGS. 2, 4, 6 and 8 as schematic blocks.

The monolithically integrated optical Schmitt trigger IC comprises an integrated photodiode 1, a two-stage amplifier 2 (transimpedance amplifier 2.1, differential amplifier 2.3, reference network 2.2 and compensating element 2.4) with Schmitt trigger stage 3 connected behind them and circuit output 4. In photodiode 1, the optical input signal is first converted into an electrical signal (photocurrent). The transimpedance amplifier 2.1 converts the photocurrent into a voltage difference which is amplified by the differential amplifier 2.3. In the Schmitt trigger stage 3, a pulse is shaped incorporating a hysteresis; at the output transistor of the open-collector output 4, a TTL-compatible signal is available, for example.

"Active-LOW" and "active-HIGH" versions are possible, with the output transistor in the "active-LOW" version switching through ("LOW" state) when the threshold value is exceeded while light is present.

In order to permit a static and dynamic synchronism of the potentials at the two inputs of the differential amplifier and thereby achieve the best possible common-mode rejection, the transimpedance amplifier stage is simulated by the first reference network in accordance with the invention, and the light-sensitive receiver element by a compensating element.

The switch-on threshold and the switch-off threshold of the Schmitt trigger stage can be individually adapted to differing signal basic levels by adjustment of resistors. The switch-off threshold must attain a certain minimum value, since reliable switch-off must be ensured even in the event of parameter fluctuations or example variations of the components.

The switch-on sensitivity of the Schmitt trigger can, in a further embodiment of the circuit, be varied as a function of the temperature. The sensitivity is preferably adjusted such that it increases as the temperature rises; this serves to compensate in part for the effect of the temperature on the optical transmission system—for example in opto-couplers between LED and photodiode.

In a different embodiment of the circuit—the compensating capacitor is replaced by a further photodiode in the compensating element—the difference between two photodiode signals can be formed.

BRIEF DESCRIPTION OF THE DRAWINGS

The circuit array in accordance with the invention and advantageous embodiments are shown on the basis of FIGS. 1 to 8, where.

DESCRIPTION OF THE PREFERRED EMBODIMENTS

Example 1: "active-LOW" Version (FIGS. 2 and 3)

Figure 1:
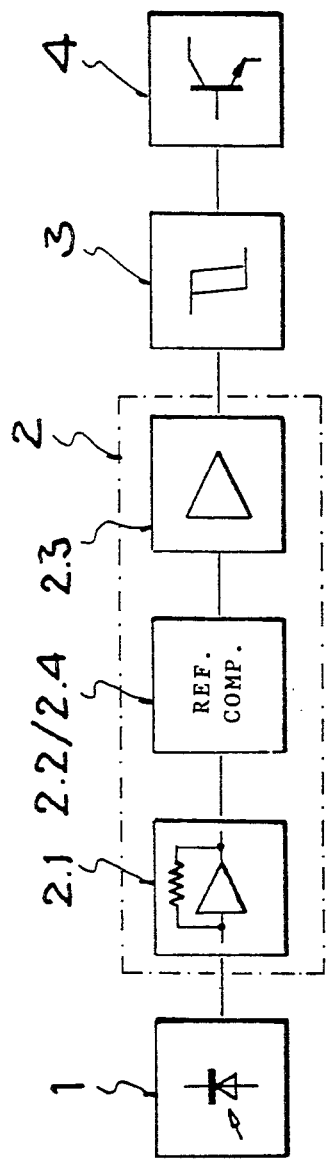
FIG. 1 shows a block circuit diagram of the various circuit components of the circuit in accordance with the invention.
Figure 2:
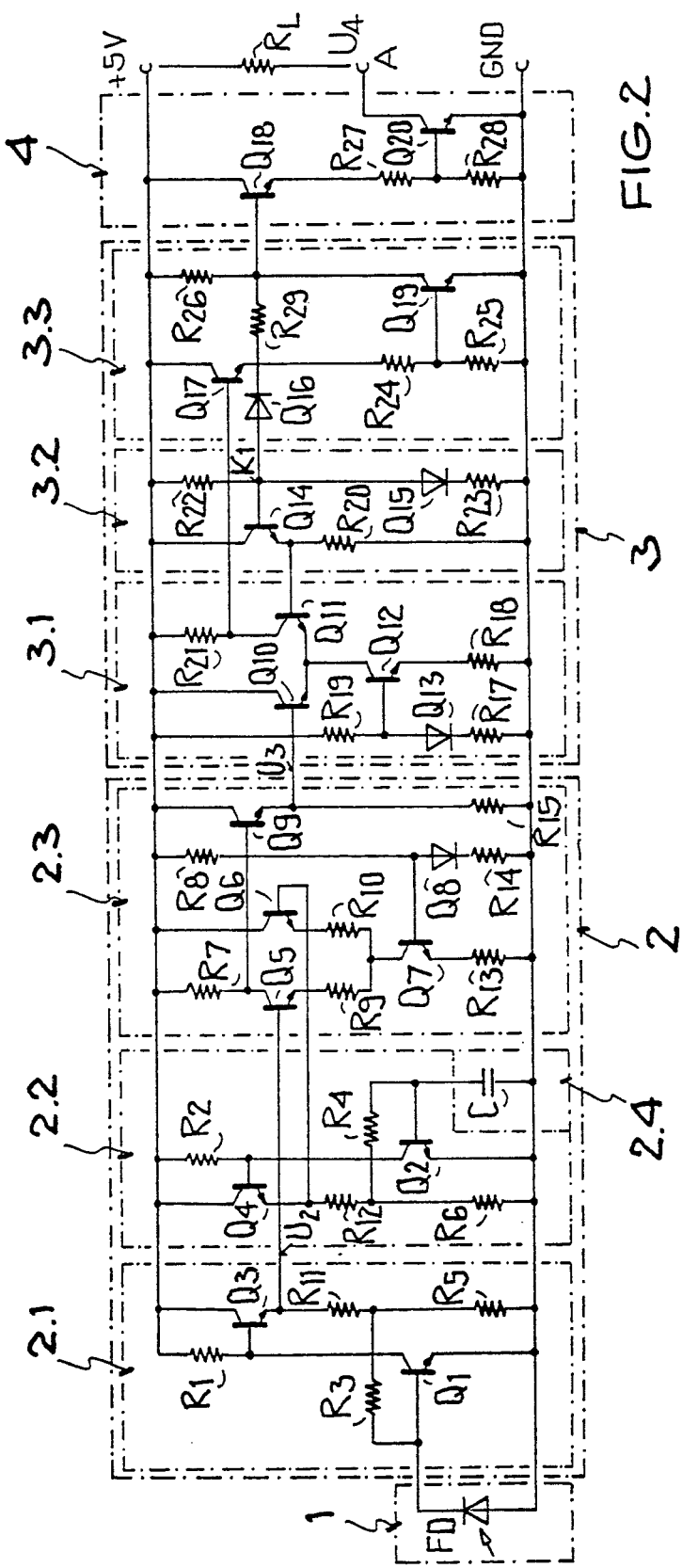
FIG. 2 shows an "active-LOW" version of an optical Schmitt trigger circuit.
Figure 3:
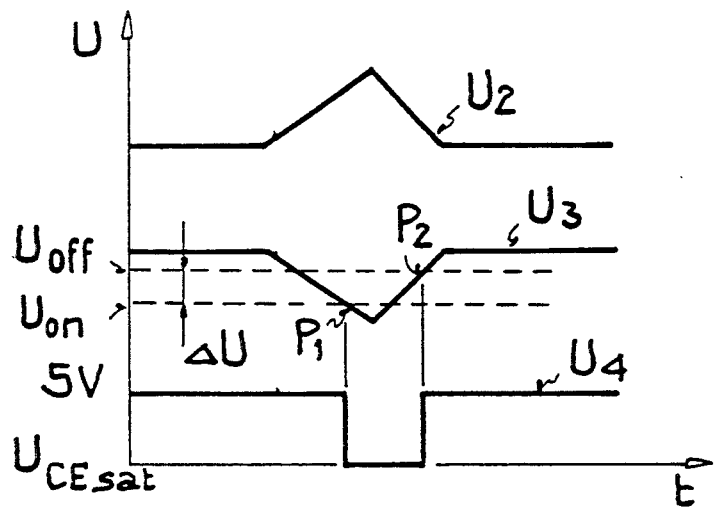
FIG. 3 shows potential and signal dependences on time of the circuit according to FIG. 2.

In accordance with the circuit diagram in FIG. 2, the design of the various circuit components and their mode of operation is described in detail.

1. Photodiode

The incident optical radiation is detected by the photodiode 1 and converted by the conversion resistor $R_3$ of the transimpedance amplifier stage 2.1 into a voltage signal.

2.1 Transimpedance Amplifier Stage

The transimpedance amplifier stage 2.1 contains, in addition to the resistor $R_3$, resistors $R_1$, $R_5$ and $R_{11}$, and transistors $Q_1$ and $Q_3$. The circuit array keeps the input time constant low, so that the working frequency of the circuit is high. The cathode-side output of the photodiode 1 is connected both to the resistor $R_3$ and to the base of transistor $Q_1$; the collector of transistor $Q_1$ is connected both to the base of transistor $Q_3$ and to one connection of the resistor $R_1$. The emitter of transistor $Q_3$ leads both to the resistor $R_{11}$, whose other connection is connected to the two resistors $R_3$ and $R_5$, and to the base connection of the first transistor $Q_5$ of the differential amplifier in the differential amplifier stage 2.3. The anode of the photodiode 1, the emitter of transistor $Q_1$ and the second connection of resistor $R_5$ are connected to ground potential (GND), the collector of transistor $Q_3$ and the second connection of resistor $R_1$ to the supply voltage (e. g. +5 V).

2.2 Reference Network

The reference network 2.2 is designed similar to the transimpedance amplifier stage 2.1, with transistors $Q_2$ and $Q_4$ of the reference network corresponding to transistors $Q_1$ and $Q_3$ of the transimpedance amplifier, and resistors $R_2$, $R_6$ and $R_{12}$ of the reference network to resistors $R_1$, $R_5$ and $R_{11}$ of the transimpedance amplifier. The emitter of transistor $Q_4$ is here connected to the base of the second transistor $Q_6$ of the differential amplifier in the differential amplifier stage 2.3. By this simulation of the transimpedance amplifier using the reference network, a static synchronism is achieved of the base potentials at the two transistors $Q_5$ and $Q_6$ of the differential amplifier of the differential amplifier stage 2.3. Fluctuations of the supply voltage and technologically related parameter fluctuations within the transimpedance amplifier stage 2.1 and reference network 2.2 circuit components therefore have no effect.

The light-sensitive receiver element, for example the photodiode 1, affects the dynamic properties of the transimpedance amplifier stage 2.1; to compensate for any dynamic interference that might occur, the light-sensitive receiver element 1 is simulated by the compensating element 2.4, for example the compensating capacitor C. As a result, a dynamic synchronism is achieved of the base potentials of the two differential amplifier transistors $Q_5$ and $Q_6$.

2.3 Differential Amplifier Stage

This stage comprises the transistors $Q_5$, $Q_6$, $Q_7$ and $Q_9$, the diode $Q_8$, and the resistors $R_7$ to $R_{10}$ and $R_{13}$ to $R_{15}$. The two transistors $Q_5$ and $Q_6$ form the principle differential amplifier, the bases of which are controlled in static and dynamic synchronism, as described above, by the transimpedance amplifier stage 2.1, the reference network 2.2 and with the aid of the compensating element 2.4. The emitters of transistors $Q_5$ and $Q_6$ are connected via the resistors $R_9$ and $R_{10}$ respectively to the common current source, the collector of transistor $Q_7$; the latter is controlled by the voltage divider $R_8$, $R_{14}$ and $Q_8$, with the base of transistor $Q_7$ being connected to the anode of diode $Q_8$ and to the resistor $R_8$. The emitter of transistor $Q_7$ is grounded via the resistor $R_{13}$, the cathode of diode $Q_8$ via the resistor $R_{14}$. The output signal of the differential amplifier stage 2.3 is output via the collector terminal of transistor $Q_5$ and via the emitter follower transistor $Q_9$ and its emitter resistor $R_{15}$ at the emitter of transistor $Q_9$ as a voltage $U_3$. The collector resistor $R_7$ of the transistor $Q_5$, the second connection of resistor $R_8$ and the collectors of the transistors $Q_6$ and $Q_9$ are connected to the supply voltage. The second connection of the emitter resistor $R_{15}$ is connected to ground potential.

3. Schmitt Trigger Stage

3.1 Differential Amplifier Stage

The two transistors $Q_{10}$ and $Q_{11}$, whose emitters are connected to one another and to the collector of the transistor $Q_{12}$ operating as a current source, form the principle "Schmitt trigger".

The collector of transistor $Q_{10}$ is connected directly to the supply voltage, the collector of transistor $Q_{11}$ via the collector resistor $R_{21}$. The base of the transistor $Q_{12}$ is controlled by the voltage divider $R_{19}$, diode $Q_{13}$ and $R_{17}$, the base being connected both to a connection of resistor $R_{19}$ and to the anode of diode $Q_{13}$; the cathode of diode $Q_{13}$ is connected to the resistor $R_{17}$. The second connection of the resistor $R_{19}$ is connected to the supply voltage, and resistor $R_{17}$ and emitter resistor $R_{18}$ of transistor $Q_{12}$ are grounded.

The base potential of transistor $Q_{10}$ is controlled by the voltage output of the differential amplifier stage 2.3 (emitter of transistor $Q_9$), the base potential of transistor $Q_{11}$ by the emitter of transistor $Q_{14}$ of a reference network 3.2. The terminal on the collector of transistor $Q_{11}$ is connected to the base of transistor $Q_{17}$ in the positive-feedback network 3.3.

3.2 Reference Network

The reference network 3.2 supplies the reference potential for the base of transistor $Q_{11}$ and comprises the voltage divider $R_{22}$, diode $Q_{15}$ and $R_{23}$, and the emitter follower transistor $Q_{14}$ with the emitter resistor $R_{20}$. The collector of the emitter follower transistor $Q_{14}$ and the second connection of the resistor $R_{22}$ are connected to the supply voltage, the second connection of the resistor $R_{23}$, whose other connection is connected to the cathode of diode $Q_{15}$, is grounded. The anode of diode $Q_{15}$, the first connection of resistor $R_{22}$ and the base of transistor $Q_{14}$ are connected to the node point $K_1$, to which is also connected the anode of diode $Q_{16}$ of the positive-feedback network 3.3.

3.3 Positive-feedback Network

Positive feedback in the Schmitt trigger stage 3 is achieved in the positive-feedback network 3.3 with the aid of the emitter follower transistor $Q_{17}$, the voltage divider of $R_{24}$, $R_{25}$, the transistor $Q_{19}$, the latter's collector resistor $R_{26}$, diode $Q_{16}$ and resistor $R_{29}$. In detail, the base of transistor $Q_{17}$ is connected to the collector of transistor $Q_{11}$, the emitter to the first connection of the resistor $R_{24}$, and the collector to the supply voltage. The anode of the diode $Q_{16}$ is connected to the base of transistor $Q_{14}$, resistor $R_{22}$ and the anode of diode $Q_{15}$, and the cathode of $Q_{16}$ to resistor $R_{29}$, whose other connection is connected both to the resistor $R_{26}$, to the collector of transistor $Q_{19}$ and to the base of the emitter follower transistor $Q_{18}$. The base of transistor $Q_{19}$ is in its turn connected to the second connection of resistor $R_{24}$ and to the resistor $R_{25}$, whose second connection and the emitter of transistor $Q_{19}$ are connected to ground potential. The second connection of resistor $R_{26}$ is connected to the supply voltage.

The switch-on threshold of the Schmitt trigger 3 is—in the "active-LOW" version described here—set using the resistor $R_{29}$ and the internal resistance of the network $R_{22}$, $Q_{15}$ and $R_{23}$; it can be changed by variation of the resistor $R_{29}$ without the switch-off threshold being affected thereby. The switch-off threshold must not be deliberately or accidentally changed, so that the switch-off condition for the optical Schmitt trigger remains assured.

FIG. 3 shows, from top to bottom, the dependences on time of the input voltage $U_2$ at the emitter of the transistor $Q_3$ of the transimpedance amplifier stage 2.1, the voltage $U_3$ at the output of the amplifier 2 or at the input of the Schmitt trigger 3 (base potential of transistor $Q_{10}$) and the voltage at the circuit output $U_4$.

The switch-on procedure in the "active-LOW" version in accordance with FIG. 2 is then achieved in accordance with FIG. 3 when the voltage $U_2$ rises high enough under the impact of radiation for the base potential $U_3$ at transistor $Q_{10}$ to be lower than the voltage $U_{on}$ (point $P_1$). The transistor $Q_{11}$ then takes over the entire current from transistor $Q_{12}$; the emitter follower $Q_{17}$ and the voltage divider $R_{24}$, $R_{25}$ are used to block the transistor $Q_{19}$. As a result, however, the diode $Q_{16}$ and resistor $R_{29}$ branch switches to the blocking state. The voltage divider $R_{22}$, $Q_{15}$, $R_{23}$ is then not loaded by the branch with the diode $Q_{16}$, with the result that the emitter potential of transistor $Q_{14}$ or the base potential of transistor $Q_{11}$ rises. The potential necessary for the switch-off operation is determined by the point $P_2$, so that the typical hysteresis of a Schmitt trigger is achieved.

In the switch-off process in the "active-LOW" version, i. e. when there is no radiation, the voltage $U_2$ drops so far (point $P_2$) that the transistor $Q_{10}$ switches to the conducting state. The transistor $Q_{10}$ takes on the full current of the current source $Q_{12}$, which blocks the transistor $Q_{11}$. The emitter follower $Q_{17}$ and the voltage divider $R_{24}$, $R_{25}$ have the effect of switching the transistor $Q_{19}$ to the conducting state; as a result, however, the collector potential of the transistor $Q_{19}$ drops sharply (approximately to the collector-emitter saturation voltage $U_{CEsat}$). As a consequence, the diode $Q_{16}$ and resistor $R_{29}$ branch becomes conductive, whereby the voltage divider $R_{22}$, $Q_{15}$, $R_{23}$ is loaded in its turn by this branch, so that the base potential of transistor $Q_{14}$ or the base potential of transistor $Q_{11}$ drops to point $P_1$. For a new switch-on operation, therefore, the voltage $U_3$ must fall below the switch-on threshold $U_{on}$.

The hysteresis is given by the voltage difference U between the switch-on threshold $U_{on}$ (point $P_1$) and the switch-off threshold $U_{off}$ (point $P_2$).

By variation of the resistor $R_{29}$, the point $P_1$, i. e. the switch-on threshold of the optical Schmitt trigger, can be changed individually without the point $P_2$, i. e. the switch-off threshold, being changed.

By variation of the resistors $R_{22}$ and $R_{23}$, the point $P_2$, i. e. the switch-off threshold of the optical Schmitt trigger, can be displaced.

4. Circuit Output

This comprises the emitter follower $Q_{18}$, whose base is connected to the resistors $R_{26}$, $R_{29}$ and the collector of the transistor $Q_{19}$, the voltage divider $R_{27}$, $R_{28}$, and for example the open-collector output transistor $Q_{20}$. The emitter of transistor $Q_{18}$ is connected to the resistor $R_{27}$, and the base of transistor $Q_{20}$ to the terminal of the voltage divider $R_{27}$, $R_{28}$; the collector of the transistor $Q_{18}$ is connected to the supply voltage, the second connection of the resistor $R_{28}$ and the emitter of the transistor $Q_{20}$ to ground.

The voltage dependence on time at the output of the optical Schmitt trigger ($U_4$) is reproduced in the bottom curve in FIG. 3, with the HIGH state being given by the supply voltage 5 V, for example, and the LOW state by the saturation voltage $U_{CEsat}$ of the output transistor $Q_{20}$.

When light is detected (point $P_1$), transistor $Q_{19}$ blocks in accordance with the above, so that the output transistor $Q_{20}$ becomes conductive via the transistor $Q_{18}$; the output is thus in the LOW state. The open-collector output can be connected to the supply voltage via a load resistor, this load resistor $R_L$ being individually predetermined for the application in question. When the radiation level falls below the minimum radiation (point $P_2$) the transistor $Q_{19}$ becomes conductive, so that the transistor $Q_{18}$ and hence the transistor $Q_{20}$ too are blocking; the output then reverts to the HIGH state.

Instead of an open-collector output, however, it is also possible to use any other circuit outputs, depending on the requirements and applications.

Example 2: "Active-HIGH" Version (FIGS. 4 and 5)

In the "active-HIGH" version of the optical Schmitt trigger, the output transistor switches to the HIGH state when a photocurrent is generated, i. e. the circuit output 4 goes to the HIGH state when light excitation is present, and to the LOW state when this excitation ceases.

Figure 4:
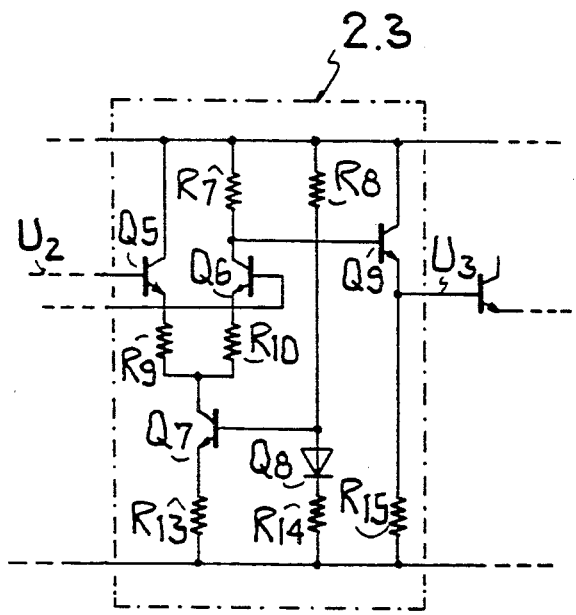
FIG. 4 shows the differential amplifier stage of an "active-HIGH" version of the optical Schmitt trigger circuit according to FIG. 2.
Figure 5:
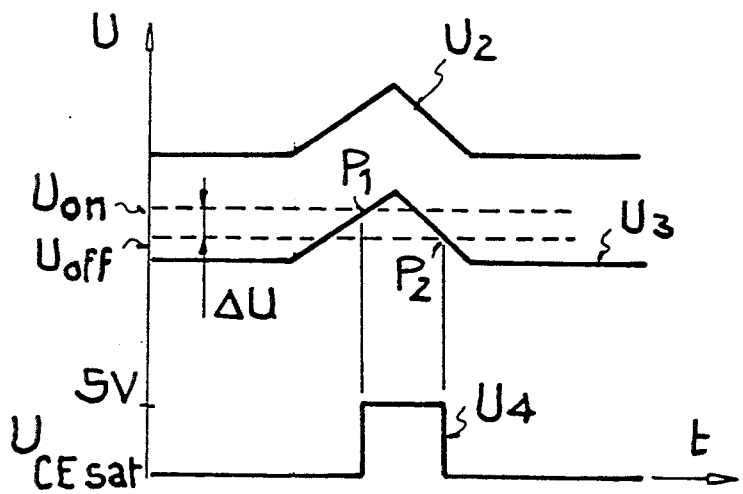
FIG. 5 shows potential and signal dependences on time of the circuit according to FIG. 4.

The required circuit is, in accordance with FIG. 4, only slightly modified in the differential amplifier part 2.3 compared with the "active-LOW" version in FIG. 2; the resistor $R_7$ is no longer, as shown in FIG. 2, the collector resistor of the transistor $Q_5$, but the collector resistor of the transistor $Q_6$, as shown in FIG. 4.

The collector terminals of the two transistors are therefore simply exchanged; accordingly, the voltage $U_3$ at the amplifier output runs exactly opposite to that of the "active-LOW" version. The voltage dependences on time of the "active-LOW" version corresponding to FIG. 3 are shown in FIG. 5 for the "active-HIGH" version.

By variation of the resistor $R_{22}$ and $R_{23}$, the point $P_1$, i. e. the switch-on threshold, can be displaced, and by variation of the resistor $R_{29}$ point $P_2$, i. e. the switch-off threshold.

The user can therefore decide on the "active-LOW" version or the "active-HIGH" version depending on requirements.

Figure 6:
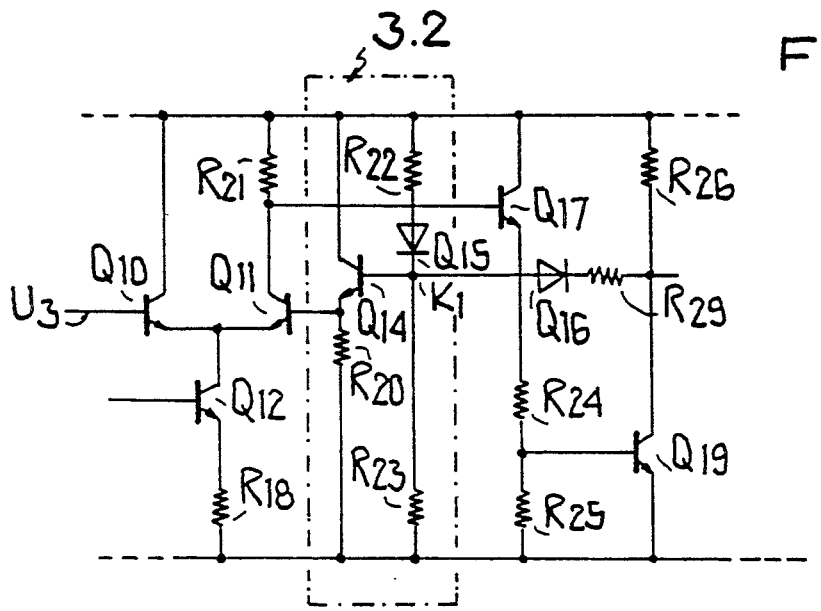
FIG. 6 shows the Schmitt trigger stage of an optical Schmitt trigger circuit whose switch-on and switch-off thresholds are set to a desired temperature-dependence.

Example 3: Adjustable Temperature-dependent Switch-on Threshold with "Active-LOW" Version (FIGS. 6 and 7)

FIG. 3 shows a circuit variant of the "active-LOW" version shown in FIG. 2 in which a variation in the reference network 3.2 of the Schmitt trigger 3 is used to effect an increase in the switch-on sensitivity of the Schmitt trigger ($U_{on}$) as the temperature rises. For this purpose, diode $Q_{15}$ is not arranged between the node point $K_1$ and the resistor $R_{23}$, as shown in FIG. 2, but between the node point $K_1$ and the resistor $R_{22}$; as a result, a desired temperature dependence for the switch-on and switch-off thresholds can be achieved.

The switch-on threshold $U_{on}$ is changed individually as a function of the temperature in order to compensate for the temperature influence of the system "LED-to-Photodiode" when the optical Schmitt trigger is used in photo-interrupters; the radiation power of the LED falls as the temperature rises, which is only inadequately compensated by the rising sensitivity of the photodiode, so that in the final analysis less photocurrent is supplied by the photodiode when the temperature rises. This effect can be countered by an increase in the switch-on sensitivity.

Figure 7:
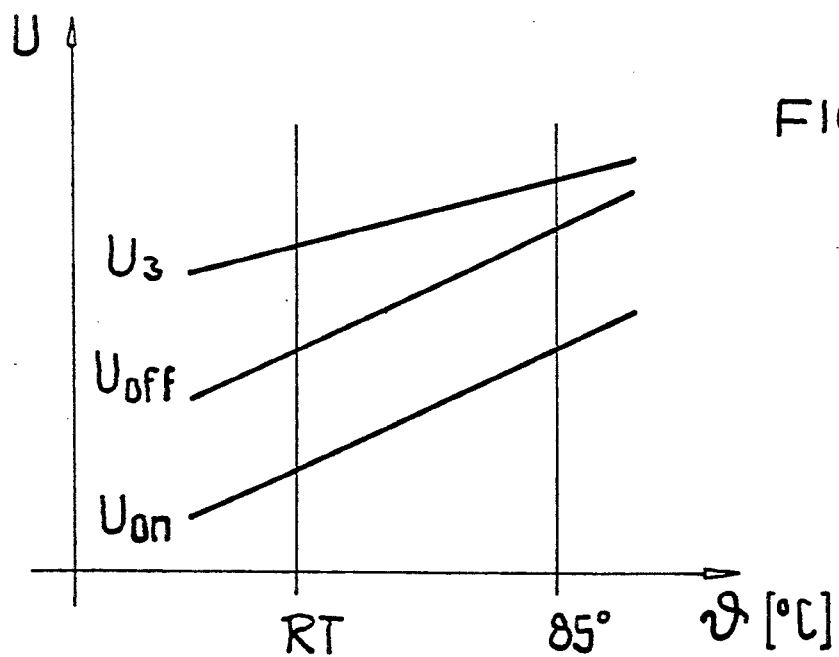
FIG. 7 shows the temperature dependence of the signals of the circuit according to FIG. 6.

In FIG. 7, the voltage at the amplifier output $U_3$, the switch-off threshold $U_{off}$ and the switch-on threshold $U_{on}$ of the Schmitt trigger is plotted against temperature. It is obvious that the rise of the $U_{on}$ straight line is steeper than that of the $U_3$ line, so that the switch-on sensitivity increases as the temperature rises.

Example 4: Difference Formation of Two Photocurrents

Figure 8:
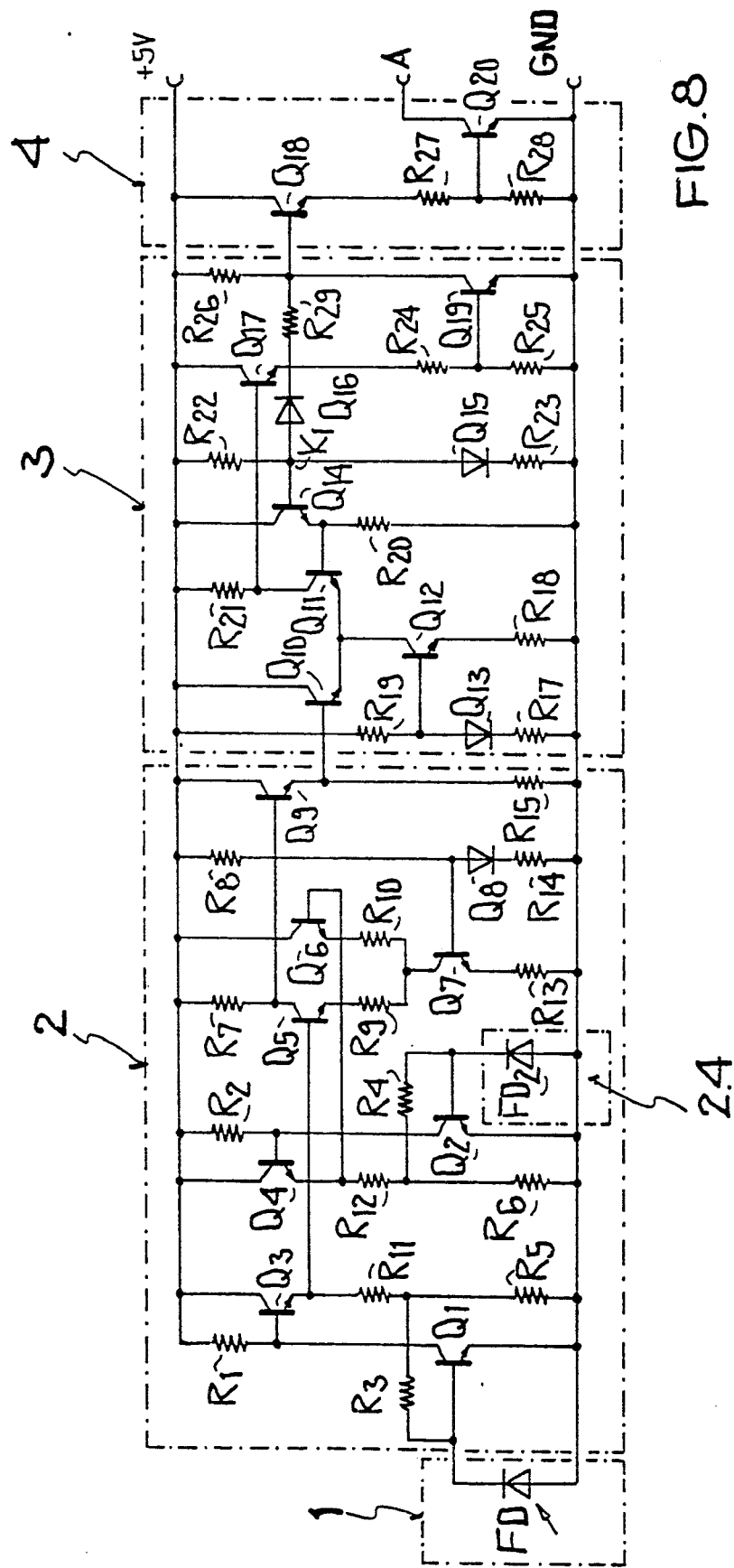
FIG. 8 shows a further embodiment of the optical Schmitt trigger circuit using which the difference between two photocurrents can be formed.

In a further circuit variant, as shown in FIG. 8, the compensating capacitor C in the compensating element 2.4 of the amplifier stage 2 is replaced by a further photodiode $FD_2$. With this circuit, the difference between two photocurrents can be evaluated and output at the circuit output 4.

The sensitivity of the described optical Schmitt trigger is, at room temperature, approx. 0.6 mW/cm² at a wavelength of 950 nm, meaning that the optical Schmitt trigger reaches the switch-on threshold $U_{on}$ at this given radiation power.

What is claimed is:

1. A circuit array for an optical Schmitt trigger in which an optical input signal is converted into an electrical output signal by means of a series connection of a light-sensitive receiver element, an amplifier stage, a Schmitt trigger stage and an output stage, wherein said amplifier stage (2) contains a transimpedance amplifier stage (2.1), a first differential amplifier stage (2.3), a first reference network (2.2) and a compensating element (2.4), wherein said Schmitt trigger stage (3) contains a second differential amplifier stage (3.1), a second reference network (3.2) and a positive-feedback network (3.3), and wherein said output signal is emitted at the circuit output (A) of said output stage (4).

2. A circuit array in accordance with claim 1, wherein the reference network (2.2) of the amplifier stage (2) possesses the same circuit design and the same circuit components as the transimpedance amplifier stage (2.1), so that the base potentials of the two transistors ($Q_5$, $Q_6$) of the differential amplifier stage (2.3) have a static synchronism.

3. A circuit array in accordance with claim 1, wherein the compensating element (2.4) possesses the same dynamic properties as the light-sensitive receiver element (1), so that the base potentials of the two transistors ($Q_5$, $Q_6$) of the differential amplifier of the differential amplifier stage (2.3) have a dynamic synchronism.

4. A circuit array in accordance with claim 1, wherein the photocurrent emitted by the light-sensitive receiver element (1) is converted by a conversion resistor ($R_3$) into a voltage ($U_2$) that is amplified by the amplifier stage (2) and transmitted at its output ($Q_9$) to the Schmitt trigger stage (3), wherein the base potentials of the two transistors ($Q_5$, $Q_6$) of the differential amplifier of the differential amplifier stage (2.3) have a static and a dynamic synchronism, and wherein the output voltage ($U_3$) of said amplifier stage (2) is the voltage at the emitter of an emitter-follower transistor ($Q_9$).

5. A circuit array in accordance with claim 1, wherein the output voltage ($U_3$) of the amplifier stage (2) is transmitted to the base of a transistor ($Q_{10}$) of the differential amplifier stage (3.1), wherein by circuit components in the Schmitt trigger stage (3) the output voltage ($U_3$) of the amplifier stage (2) is converted to a voltage having only two states, as a function of the value of said output voltage in comparison with a switch-on threshold ($U_{on}$) or switch-off threshold ($U_{off}$), and wherein said voltage is output as the output voltage ($U_4$) at the circuit output (4) either as a HIGH level or as a LOW level.

6. A circuit array in accordance with claim 2, wherein the transimpedance amplifier stage (2.1) and the reference network (2.2) of the amplifier stage (2) contain as circuit components transistors ($Q_1$, $Q_3$, and $Q_2$, $Q_4$ respectively) and resistors ($R_1$, $R_3$, $R_5$, $R_{11}$ and $R_2$, $R_4$, $R_6$, $R_{12}$ respectively), the bases of the first transistors ($Q_1$ and $Q_2$ respectively) being connected to the light-sensitive receiver element (1) and to the compensating element (2.4) respectively and the collectors to the bases of the second transistors ($Q_3$ and $Q_4$) respectively, and wherein the emitters of said second transistors ($Q_3$ and $Q_4$) control the bases of the two transistors ($Q_5$, $Q_6$) of the differential amplifier of the differential amplifier stage (2.3).

7. A circuit array in accordance with claim 5, wherein the differential amplifier stage (3.1) of the Schmitt trigger stage (3) contains transistors ($Q_{10}$, $Q_{11}$, $Q_{12}$), resistors ($R_{17}$, $R_{18}$, $R_{19}$) and a diode ($Q_{13}$), wherein the reference network (3.2) contains a transistor ($Q_{14}$), resistors ($R_{23}$, $R_{20}$, $R_{22}$) and a diode ($Q_{15}$), wherein the bases of said transistors ($Q_{10}$ and $Q_{11}$ respectively) of the differential amplifier of said differential amplifier stage (3.1) are connected to the output of the amplifier stage (2) and to the emitter of said transistor ($Q_{14}$) of the reference network (3.2), wherein the processed output voltage ($U_3$) of said amplifier stage (2) is transmitted to the output stage (4) via the collector terminal of a transistor ($Q_{11}$) of said differential amplifier, an emitter-follower transistor ($Q_{17}$) and a transistor ($Q_{19}$) in a common emitter stage, and wherein the acutal output transistor ($Q_{20}$) is controlled by an emitter-follower transistor ($Q_{18}$).

8. A circuit array in accordance with claim 7, wherein the switch-on threshold ($U_{on}$) and the switch-off threshold ($U_{off}$) of the Schmitt trigger stage (3) can be changed by variation of the resistors ($R_{22}$, $R_{23}$, $R_{29}$) in the reference network (3.2) or in the positive-feedback network (3.3) of said Schmitt trigger stage (3).

9. A circuit array in accordance with claim 1, wherein the output stage (4) is designed as an open-collector output stage, collector output stage or totem-pole output stage.

10. A circuit array in accordance with claim 6, wherein a collector resistor ($R_7$) is connected to the collector of the first transistor ($Q_5$) of the two transistors forming the differential amplifier ($Q_5$, $Q_6$) of the differential amplifier stage (2.3), and wherein the circuit output (4) goes to the LOW state when a minimum radiation onto the light-sensitive receiver element (1) is exceeded ($P_1$) and to the HIGH state when the radiation level falls below a value corresponding to point ($P_2$).

11. A circuit array in accordance with claim 10, wherein the switch-on threshold ($U_{on}$) of the Schmitt trigger stage (3) can be changed by variation of a resistor ($R_{29}$) in the positive-feedback network (3.3) without the switch-off threshold ($U_{off}$) being changed, and wherein said switch-off threshold ($U_{off}$) of said Schmitt trigger stage (3) can be changed by variation of two resistors ($R_{22}$, $R_{23}$) of a voltage divider in the reference network (3.2).

12. A circuit array in accordance with claim 6, wherein a collector resistor ($R_7$) is connected to the collector of the second transistor ($Q_6$) of the two transistors forming the differential amplifier ($Q_5$, $Q_6$) of the differential amplifier stage (2.3), and wherein the circuit output (4) goes to the HIGH state when a minimum radiation onto the light-sensitive receiver element (1) es exceeded ($P_1$) and to the LOW state when the radiation level falls below a value corresponding to point ($P_2$).

13. A circuit array in accordance with claim 12, wherein the switch-on threshold ($U_{on}$) of the Schmitt trigger stage (3) can be changed by variation of two resistors ($R_{22}$, $R_{23}$) of a voltage divider in the reference network (3.2), and wherein the switch-off threshold ($U_{off}$) of said Schmitt trigger stage (3) can be changed by variation of a resistor ($R_{29}$) in the positve-feedback network (3.3).

14. A circuit array in accordance with claim 7, wherein the anode of diode ($Q_{15}$) in the reference network (3.2) of the Schmitt trigger stage (3) is connected to a resistor ($R_{22}$) connected to the supply voltage and the cathode of said diode ($Q_{15}$) to a node point ($K_1$), and wherein the switch-on threshold ($U_{on}$) and the switch-off threshold ($U_{off}$) of the optical Schmitt trigger increases with rising temperature faster than the quiescent voltage ($U_3$) at the output of the amplifier stage (2).

15. A circuit array in accordance with claim 1, wherein the light-sensitive receiver element (1) is a photodiode (FD) and the compensating element (2.4) a capacitor (C).

16. A circuit array in accordance with claim 1, wherein the light-sensitive receiver element (1) is a photodiode (FD) and the compensating element (2.4) a further photodiode ($FD_2$).

17. A circuit array in accordance with claim 10, wherein the LOW level is given by the saturation voltage ($U_{CEsat}$) of the output transistor ($Q_{20}$) and the HIGH level substantially by the voltage level of the supply voltage.

* * * * *